(12) United States Patent
Fang et al.

(10) Patent No.: US 12,191,112 B2
(45) Date of Patent: Jan. 7, 2025

(54) SYSTEM AND METHOD FOR DEFECT INSPECTION USING VOLTAGE CONTRAST IN A CHARGED PARTICLE SYSTEM

(71) Applicant: ASML NETHERLANDS B.V., Veldhoven (NL)

(72) Inventors: Wei Fang, Milpitas, CA (US); Zhengwei Zhou, San Jose, CA (US); Lingling Pu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 385 days.

(21) Appl. No.: 17/786,190

(22) PCT Filed: Dec. 17, 2020

(86) PCT No.: PCT/EP2020/086903
§ 371 (c)(1),
(2) Date: Jun. 16, 2022

(87) PCT Pub. No.: WO2021/123075
PCT Pub. Date: Jun. 24, 2021

(65) Prior Publication Data
US 2023/0012946 A1   Jan. 19, 2023

Related U.S. Application Data

(60) Provisional application No. 62/950,786, filed on Dec. 19, 2019.

(51) Int. Cl.
*H01J 37/24*   (2006.01)
*H01J 37/244*   (2006.01)
(Continued)

(52) U.S. Cl.
CPC ............ *H01J 37/28* (2013.01); *H01J 37/243* (2013.01); *H01J 37/244* (2013.01);
(Continued)

(58) Field of Classification Search
CPC ........ H01J 37/28; H01J 37/243; H01J 37/244; H01J 37/263; H01J 37/265; H01J 2237/2817
See application file for complete search history.

(56) References Cited

U.S. PATENT DOCUMENTS 6,172,363 B1 * 1/2001 Shinada ............... G01R 31/307
850/10
2002/0149381 A1   10/2002 Shindo et al.
(Continued)

FOREIGN PATENT DOCUMENTS

TW   200933776 A   8/2009
TW   201734439 A   10/2017
(Continued)

OTHER PUBLICATIONS

Office Action issued by the Intellectual Property Office (IPO) in related ROC (Taiwan) Patent Application No. 109144171, mailed Sep. 17, 2021 (10 pgs.).
(Continued)

*Primary Examiner* — Sean M Luck
(74) *Attorney, Agent, or Firm* — Finnegan, Henderson, Farabow, Garrett & Dunner, LLP

(57) ABSTRACT

A system and method for defect inspection using voltage contrast in a charged particle system are provided. Some embodiments of the system and method include positioning the stage at a first position to enable a first beam of the plurality of beams to scan a first surface area of the wafer at a first time to generate a first image associated with the first surface area; positioning the stage at a second position to enable a second beam of the plurality of beams to scan the first surface area at a second time to generate a second image associated with the first surface area; and comparing the first
(Continued)

image with the second image to enable detecting whether a defect is identified in the first surface area of the wafer.

15 Claims, 11 Drawing Sheets

(51) Int. Cl.
 *H01J 37/26* (2006.01)
 *H01J 37/28* (2006.01)
(52) U.S. Cl.
 CPC .......... *H01J 37/263* (2013.01); *H01J 37/265* (2013.01); *H01J 2237/2817* (2013.01)

(56) References Cited

U.S. PATENT DOCUMENTS

| | | |
|---|---|---|
| 2004/0161866 A1 | 8/2004 | Kang |
| 2014/0312224 A1* | 10/2014 | Murakawa ............ H01J 37/265 |
| | | 250/307 |
| 2017/0047197 A1 | 2/2017 | Hotta et al. |
| 2018/0024082 A1 | 1/2018 | Ando |
| 2019/0259572 A1 | 8/2019 | Noda et al. |

FOREIGN PATENT DOCUMENTS

| | | |
|---|---|---|
| TW | 201923373 A | 6/2019 |
| TW | 201933412 A | 8/2019 |
| WO | WO 2019057644 A1 | 3/2019 |

OTHER PUBLICATIONS

International Search Report and Written Opinion received from the International Search Authority issued in related International Application No. PCT/EP2020/086903 mailed Apr. 21, 2021 (10 pgs.).

Office Action of the Intellectual Property Office of Taiwan issued in related Taiwanese Patent Application No. 109144171; mailed Jun. 21, 2023 (9 pgs.).

* cited by examiner

SYSTEM AND METHOD FOR DEFECT INSPECTION USING VOLTAGE CONTRAST IN A CHARGED PARTICLE SYSTEM

CROSS-REFERENCE TO RELATED APPLICATIONS

This application claims priority to International Application No. PCT/EP2020/086903, filed Dec. 17, 2020, and published as WO 2021/123075 A1, which claims priority of U.S. application 62/950,786 which was filed on Dec. 19, 2019. The contents of these applications are incorporated herein by reference in their entireties.

TECHNICAL FIELD

The present disclosure generally relates to the field of inspecting a wafer for defects using voltage contrast in a charged particle beam system.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments consistent with the present disclosure include systems and methods for inspecting a wafer using voltage contrast in a charged particle beam system. The system includes a controller including circuitry configured to move the stage at a first speed to a first position to enable a first beam of the plurality of beams to scan a first surface area of the wafer at a first time to generate a first image associated with the first surface area; move the stage at a second speed to a second position to enable a second beam of the plurality of beams to scan the first surface area at a second time to generate a second image associated with the first surface area; detect a defect in the first surface area of the wafer based on a comparison of the first image with the second image; and adjust a time difference between the first time and the second time by adjusting a speed of the stage, wherein the time difference is greater than zero and wherein the speed of the stage is greater than zero during inspection.

The method for inspection includes moving the stage at a first speed to a first position to enable a first beam of the plurality of beams to scan a first surface area of the wafer at a first time to generate a first image associated with the first surface area; moving the stage at a second speed to a second position to enable a second beam of the plurality of beams to scan the first surface area at a second time to generate a second image associated with the first surface area; detecting a defect in the first surface area of the wafer based on a comparison of the first image with the second image; and adjusting a time difference between the first time and the second time by adjusting a speed of the stage, wherein the time difference is greater than zero and wherein the speed of the stage is greater than zero during inspection.

The non-transitory computer readable medium stores a set of instructions that is executable by at least one processor of a computing device to cause the computing device to perform a method for inspecting a wafer, the method comprising moving the stage at a first speed to a first position to enable a first beam of the plurality of beams to scan a first surface area of the wafer at a first time to generate a first image associated with the first surface area; moving the stage at a second speed to a second position to enable a second beam of the plurality of beams to scan the first surface area at a second time to generate a second image associated with the first surface area; detecting a defect in the first surface area of the wafer based on a comparison of the first image with the second image; and adjusting a time difference between the first time and the second time by adjusting a speed of the stage, wherein the time difference is greater than zero and wherein the speed of the stage is greater than zero during inspection.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DETAILED DESCRIPTION

Figure 1:
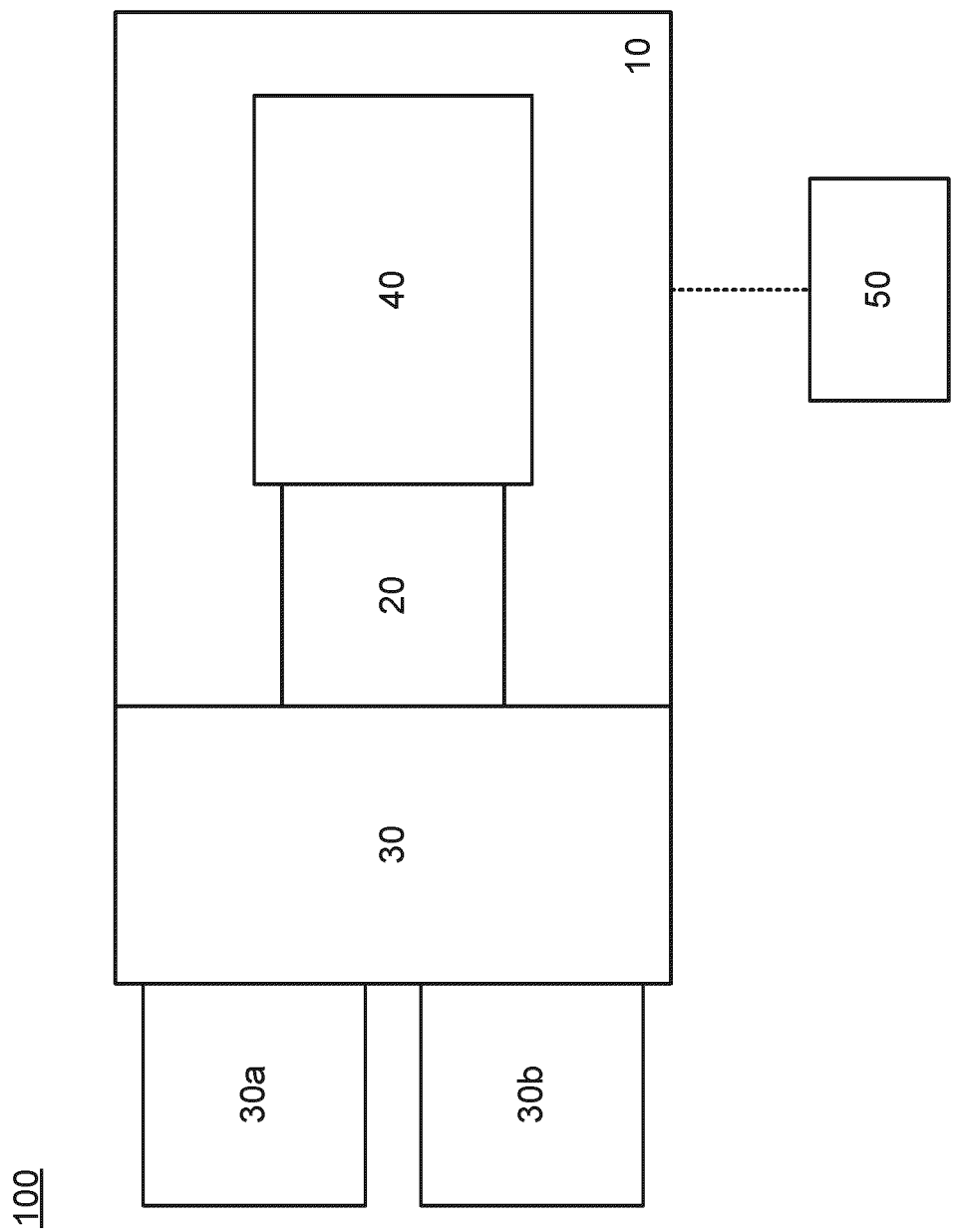
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures during their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

A SEM may obtain an image of the wafer that shows the internal device structure under the area of the wafer being inspected. Single beam SEM inspection tools may obtain a single image of an area of a wafer and compare the obtained image against a reference image that represents the corresponding device structures absent any defect. A difference detected from the comparison of the images may indicate a defect in the wafer.

Single beam SEM inspection tools, however, suffer from constraints. Capturing a single image at an arbitrary point in time may not be useful to identify a defect in some devices because the electrical characteristics of the device structure may change over time. That is, some defects may appear in an image for a short period of time due to subtle differences from the reference device or due to electrical current sensitivity. For example, due to the time-dependent behavior of some devices, one image captured at a first time by the single beam may show a difference from the reference image while another image captured at a second time by the single beam may fail to show any differences from the reference image. Therefore, a single beam SEM inspection tool may not reliably identify a defect in some device structures.

Some single beam SEM inspection tools may obtain multiple images of the same area of a wafer. Each image of the multiple images may be obtained at a different time. By comparing the multiple images of the same area of the wafer, the single beam SEM inspection tool may identify a defect in the wafer. Obtaining multiple images using a single beam SEM inspection tool, however, also suffers from constraints. In this type of inspection, the time span between each image frame is fixed and long. Due to the long time span between frames (e.g., due to the low rate of images captured), this type of inspection may still fail to capture an image of a defect (e.g., fail to detect a change in electrical characteristics caused by the defect).

Some of the disclosed embodiments provide systems and methods that address some or all of these disadvantages by using a multi-beam inspection tool to obtain multiple images of the same area of a wafer more quickly and with controllable timing between images, and compare the multiple images (e.g., voltage contrast images 534 and 536 of FIG. 5) to identify defects in the wafer. The disclosed embodiments provide systems and methods that may scan an area of a wafer using a plurality of beams to generate a plurality of images of the area of the wafer, thereby allowing for wafer defect detection and higher throughput.

FIG. 1 illustrates a schematic diagram of an exemplary EBI system 100, consistent with embodiments of the present disclosure. As shown in FIG. 1, EBI system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30*a* and a second loading port 30*b*. EFEM 30 may include additional loading ports. First loading port 30*a* and second loading port 30*b* may, for example, receive wafer front opening unified pods (FOUPs) that contain wafers (e.g., semiconductor wafers or wafers made of other materials) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. Electron beam tool 40 may comprise a multi-beam electron inspection tool.

A controller 50 is electronically connected to electron beam tool 40. Controller 50 may be a computer configured to execute various controls of EBI system 100. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
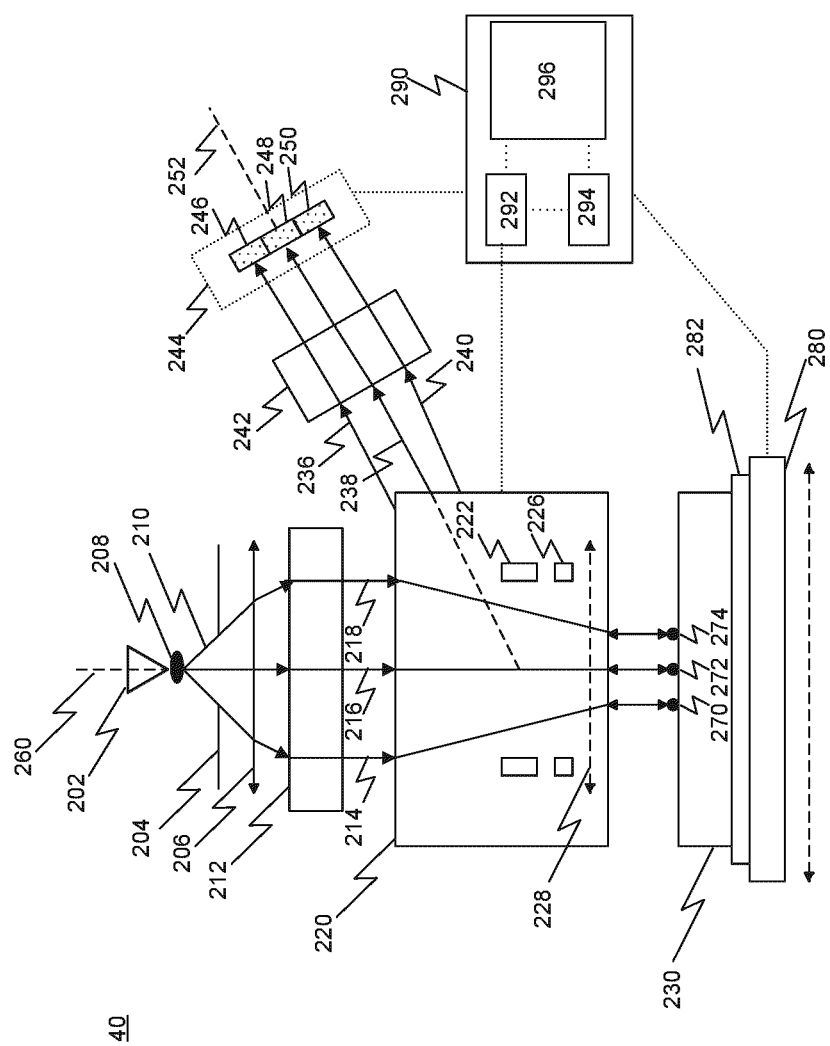
FIG. 2 is a schematic diagram illustrating an exemplary multi-beam electron beam tool, consistent with embodiments of the present disclosure that can be a part of the exemplary EBI system of FIG. 1.

FIG. 2 illustrates a schematic diagram of an exemplary multi-beam electron beam tool 40 (also referred to herein as apparatus 40) and an image processing system 290 that may be configured for use in EBI system 100 (FIG. 1), consistent with embodiments of the present disclosure.

Electron beam tool 40 comprises an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a motorized wafer stage 280, a wafer holder 282, multiple secondary electron beams 236, 238, and 240, a secondary optical system 242, and an electron detection device 244. Primary projection optical system 220 can comprise a beam separator 222, a deflection scanning unit 226, and an objective lens 228. Electron detection device 244 can comprise detection sub-regions 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 40. Secondary optical system 242 and electron detection device 244 can be aligned with a secondary optical axis 252 of apparatus 40.

Electron source 202 can comprise a cathode, an extractor or an anode, wherein primary electrons can be emitted from the cathode and extracted or accelerated to form primary electron beam 210 with a crossover (virtual or real) 208. Primary electron beam 210 can be visualized as being emitted from crossover 208. Gun aperture 204 can block off peripheral electrons of primary electron beam 210 to reduce Coulomb effect. The Coulomb effect may cause an increase in size of probe spots.

Source conversion unit 212 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit plurality of beamlets 214, 216, and 218. While three beamlets 214, 216, and 218 are shown in FIG. 2, embodiments of the present disclosure are not so limited. For example, in some embodiments, an apparatus 40 may be configured to generate a first number of beamlets. In some embodiments, the first number of beamlets may be in a range from 1 to 1000. In some embodiments, the first number of beamlets may be in a range from 200-500. In an exemplary embodiment, an apparatus 40 may generate 400 beamlets.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for imaging, and can form a plurality of probe spots 270, 272, and 274 on a surface of wafer 230.

Beam separator 222 can be a beam separator of Wien filter type generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can also be non-zero. Beam separator 222 can separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons (energies ≤50 eV) and backscattered electrons (energies between 50 eV and landing energies of beamlets 214, 216, and 218). Secondary optical system 242 can focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals (e.g., voltage, current, etc.) used to reconstruct an image of surface area of wafer 230.

The generated signals may represent intensities of secondary electron beams 236, 238, and 240 and may provide the signals to image processing system 290 in communication with electron detection device 244, primary projection optical system 220, and motorized wafer stage 280. The movement speed of motorized stage 280 may be adjusted to adjust the time intervals between consecutive beam scans of an area on wafer 230. The time intervals may need to be adjusted due to different materials on wafer 230 having different resistance-capacitance characteristics, thereby exhibiting varying sensitivity to imaging timing. In some embodiments, controller 50 may enable motorized stage 280 to move wafer 230 in a direction continuously at a constant speed. In other embodiments, controller 50 may enable motorized stage 280 to change the speed of the movement of wafer 230 over time depending on the steps of scanning process. The continuous movement of the stage 280 may coincide with positioning stage 280 at various positions to enable different beams to scan particular surface areas of wafer 230 at different times.

The intensity of secondary electron beams 236, 238, and 240 may vary according to the external or internal structure of wafer 230, and thus may indicate whether wafer 230 includes defects. Moreover, as discussed above, beamlets

214, 216, and 218 may be projected onto different locations of the top surface of wafer 230, or different sides of wafer 230 at a particular location, to generate secondary electron beams 236, 238, and 240 of different intensities. Therefore, by mapping the intensity of secondary electron beams 236, 238, and 240 with the areas of wafer 230, image processing system 290 may reconstruct an image that reflects the characteristics of internal or external structures of wafer 230.

In some embodiments, image processing system 290 may include an image acquirer 292, a storage 294, and a controller 296. Image acquirer 292 may comprise one or more processors. For example, image acquirer 292 may comprise a computer, server, mainframe host, terminals, personal computer, any kind of mobile computing devices, and the like, or a combination thereof. Image acquirer 292 may be communicatively coupled to electron detection device 244 of electron beam tool 40 through a medium such as an electrical conductor, optical fiber cable, portable storage media, IR, Bluetooth, internet, wireless network, wireless radio, or a combination thereof. In some embodiments, image acquirer 292 may receive a signal from electron detection device 244 and may construct an image. Image acquirer 292 may thus acquire images of wafer 230. Image acquirer 292 may also perform various post-processing functions, such as generating contours, superimposing indicators on an acquired image, and the like. Image acquirer 292 may be configured to perform adjustments of brightness and contrast of acquired images. In some embodiments, storage 294 may be a storage medium such as a hard disk, flash drive, cloud storage, random access memory (RAM), other types of computer readable memory, and the like. Storage 294 may be coupled with image acquirer 292 and may be used for saving scanned raw image data as original images, and post-processed images. Image acquirer 292 and storage 294 may be connected to controller 296. In some embodiments, image acquirer 292, storage 294, and controller 296 may be integrated together as one control unit.

In some embodiments, image acquirer 292 may acquire one or more images of a wafer based on an imaging signal received from electron detection device 244. An imaging signal may correspond to a scanning operation for conducting charged particle imaging. An acquired image may be a single image comprising a plurality of imaging areas. The single image may be stored in storage 294. The single image may be an original image that may be divided into a plurality of regions. Each of the regions may comprise one imaging area containing a feature of wafer 230. The acquired images may comprise multiple images of a single imaging area of wafer 230 sampled multiple times over a time sequence. The multiple images may be stored in storage 294. In some embodiments, image processing system 290 may be configured to perform image processing steps with the multiple images of the same location of wafer 230.

In some embodiments, image processing system 290 may include measurement circuitries (e.g., analog-to-digital converters) to obtain a distribution of the detected secondary electrons. The electron distribution data collected during a detection time window, in combination with corresponding scan path data of beamlets 214, 216, and 218 incident on the wafer surface, can be used to reconstruct images of the wafer structures under inspection. The reconstructed images can be used to reveal various features of the internal or external structures of wafer 230, and thereby can be used to reveal any defects that may exist in the wafer.

Figure 3:
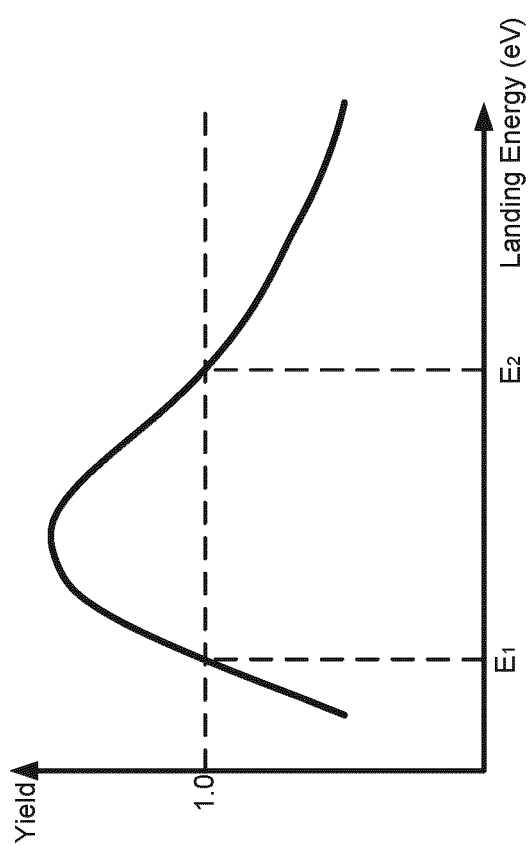
FIG. 3 is an exemplary graph showing a yield of secondary electrons relative to landing energy of primary electrons, consistent with embodiments of the present disclosure.

FIG. 3 illustrates an exemplary graph showing a yield rate of secondary electrons relative to landing energy of primary electron beamlets, consistent with embodiments of the present disclosure. The graph illustrates the relationship of the landing energy of a plurality of beamlets of a primary electron beam (e.g., plurality of beamlets 214, 216, and 218 of primary electron beam 210 of FIG. 2) and the yield rate of secondary electron beams (e.g., secondary electron beams 236, 238, and 240 of FIG. 2). The yield rate indicates the number of secondary electrons that are produced in response to the impact of the primary electrons. For example, a yield rate greater than 1.0 indicates that more secondary electrons may be produced than the number of primary electrons that have landed on the wafer. Similarly, a yield rate of less than 1.0 indicates that less secondary electrons may be produced in response to the impact of the primary electrons.

As shown in the graph of FIG. 3, when the landing energy of the primary electrons is within a range from $E_1$ to $E_2$, more electrons may leave the surface of the wafer than land onto the surface of the wafer, which may result in a positive electrical potential at the surface of the wafer. In some embodiments, defect inspection may be performed in the foregoing range of landing energies, which is called "positive mode." An electron beam tool (e.g., multi-beam electron beam tool 40 of FIG. 2) may generate a darker voltage contrast image of a device structure with a more positive surface potential since a detection device (e.g., detection device 244 of FIG. 2) may receive less secondary electrons (see FIG. 4).

When the landing energy is lower than $E_1$ or higher than $E_2$, less electrons may leave the surface of the wafer, thereby resulting in a negative electrical potential at the surface of the wafer. In some embodiments, defect inspection may be performed in this range of the landing energies, which is called "negative mode." An electron beam tool (e.g., multi-beam electron beam tool 40 of FIG. 2) may generate a brighter voltage contrast image of a device structure with a more negative surface potential a detection device (e.g., detection device 244 of FIG. 2) may receive more secondary electrons (see FIG. 4).

In some embodiments, the landing energy of the primary electron beams may be controlled by the total bias between the electron source and the wafer.

Figure 4:
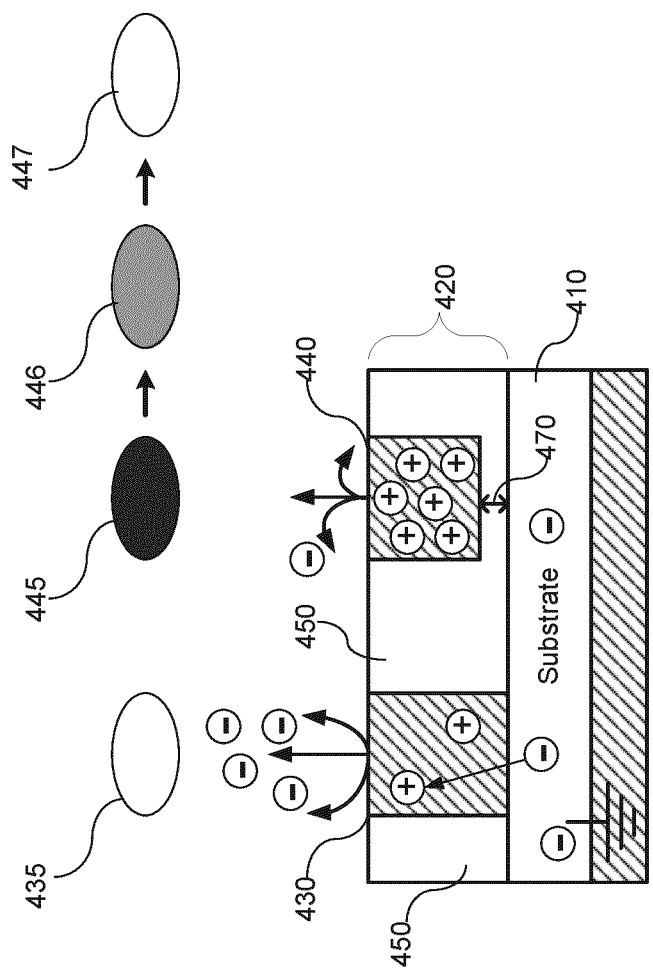
FIG. 4 is a schematic diagram illustrating voltage contrast response of a wafer, consistent with embodiments of the present disclosure.

FIG. 4 illustrates a schematic diagram of a voltage contrast response of a wafer, consistent with embodiments of the present disclosure. In some embodiments, physical and electrical defects in a wafer (e.g., resistive shorts and opens, defects in deep trench capacitors, back end of line (BEOL) defects, etc.) can be detected using a voltage contrast method of a charged particle inspection system. Defect detection using voltage contrast images may use a pre-scanning process (i.e., a charging, flooding, neutralization, or prepping process), where charged particles are applied to an area of the wafer (e.g., wafer 230 of FIG. 2) to be inspected before conducting the inspection.

In some embodiments, an electron beam tool (e.g., multi-beam electron beam tool 40 of FIG. 2) may be used to detect defects in internal or external structures of a wafer (e.g., wafer 230 of FIG. 2) by illuminating the wafer with a plurality of beamlets of a primary electron beam (e.g., plurality of beamlets 214, 216, and 218 of primary electron beam 210 of FIG. 2) and measuring a voltage contrast response of the wafer to the illumination. In some embodiments, the wafer may comprise a test device region 420 that is developed on a substrate 410. In some embodiments, test device region 420 may include multiple device structures 430 and 440 separated by insulating material 450. For example, device structure 430 is connected to substrate 410. In contrast, device structure 440 is separated from substrate 410 by insulating material 450 such that a thin insulator structure 470 (e.g., thin oxide) exists between device structure 440 and substrate 410.

The electron beam tool may generate secondary electrons (e.g., secondary electrons 236, 238, and 240 of FIG. 2) from the surface of test device region 420 by scanning the surface of test device region 420 with a plurality of beamlets of a primary electron beam (e.g., plurality of beamlets 214, 216, and 218 of primary electron beam 210 of FIG. 2). As explained above, when the landing energy of the primary electrons is between $E_1$ and $E_2$ (i.e., the yield rate is greater than 1.0 in FIG. 3), more electrons may leave the surface of the wafer than land on the surface, thereby resulting in a positive electrical potential at the surface of the wafer.

As shown in FIG. 4, a positive electrical potential may build-up at the surface of a wafer. For example, after an electron beam tool scans test device region 420 (e.g., during a pre-scanning process), device structure 440 may retain more positive charges because device structure 440 is not connected to an electrical ground in substrate 410, thereby resulting in a positive electrical potential at the surface of device structure 440. In contrast, primary electrons with the same landing energy (i.e., the same yield rate) applied to device structure 430 may result in less positive charges retained in device structure 430 since positive charges may be neutralized by electrons supplied by the connection to substrate 410.

An image processing system (e.g., image processing system 290 of FIG. 2) of an electron beam tool (e.g., multi-beam electron beam tool 40 of FIG. 2) may generate voltage contrast images 435 and 445 of corresponding device structures 430 and 440, respectively. For example, device structure 430 is shorted to the ground and may not retain built-up positive charges. Accordingly, when primary electron beamlets land on the surface of the wafer during inspection, device structure 430 may repel more secondary electrons thereby resulting in a brighter voltage contrast image. In contrast, because device structure 440 has no connection to substrate 410 or any other grounds, device structure 440 may retain a build-up of positive charges. This build-up of positive charges may cause device structure 440 to repel less secondary electrons during inspection, thereby resulting in a darker voltage contrast image.

An electron beam tool (e.g., multi-beam electron beam tool 40 of FIG. 2) may pre-scan the surface of a wafer by supplying electrons to build up the electrical potential on the surface of the wafer. After pre-scanning the wafer, the electron beam tool may obtain images of multiple dies within the wafer. Because the dies may comprise identical device structures, defects may be detected by comparing the differences in voltage contrast images from multiple dies. For example, if the voltage contrast level of one image is different from the voltage contrast level of the other images, the die corresponding to the different voltage contrast level may have a defect where the mismatch is present in the image. Pre-scanning is applied to the wafer under the assumption that the electrical surface potential built-up on the surface of the wafer during pre-scanning will be retained during inspection and will remain above the detection threshold of the electron beam tool.

However, the built-up surface potential level may change during inspection due to the effects of electrical breakdown or tunneling, thereby resulting in failure to detect defects. For example, when a high voltage is applied to a high resistance thin device structure (e.g., thin oxide), such as an insulator structure 470, leakage current may flow through the high resistance structure, thereby preventing the structure from functioning as a perfect insulator. This may affect circuit functionality and result in a device defect. A similar effect of leakage current may also occur in a structure with improperly formed materials or a high resistance metal layer, for example a cobalt silicide (e.g., $CoSi$, $CoSi_2$, $Co_2Si$, $Co_3Si$, etc.) layer between a tungsten plug and a source or drain area of a field-effect transistor (FET).

A defective etching process may leave a thin oxide resulting in unwanted electrical blockage (e.g., open circuit) between two structures (e.g., device structure 440 and substrate 410) intended to be electrically connected. For example, device structures 430 and 440 may be designed to make contact with substrate 410 and function identically, but due to manufacturing errors, insulator structure 470 may exist in device structure 440. In this case, insulator structure 470 may represent a defect susceptible to a breakdown effect.

If insulator 470 is sufficiently thick (e.g., greater than 10 nm), then the positive charges built-up in device structure 440 may not leak through insulator structure 470 and an electron beam tool may be able to detect the defect by obtaining a single voltage contrast image 445 during inspection and comparing the image to a reference voltage contrast image 435. However, if insulator 470 is thin (e.g., less than 10 nm), then the positive charges built-up in device structure 440 may decrease over time due to leakage current. As device structure 440 loses positive charges to leakage current over time, the voltage contrast level in device structure 440 may also change over time from dark to light. Depending on the time at which the electron beam tool captures an image, the electron beam tool may fail to detect any defects from the images due to device structure 440 having a voltage contrast level lower than the threshold of the detection device. For example, if a single beam electron beam tool is used for wafer inspection after device structure 440 loses positive charges to leakage, the single beam electron beam tool may capture voltage contrast image 447, which shows no difference from voltage contrast image 435 (i.e., no difference from a device structure without defects).

A multi-beam electron beam tool (e.g., electron beam tool 40 of FIG. 2) may be used to detect device defects that are susceptible to time-dependent changes of built-up charges on a wafer. For example, a multi-beam electron tool may use a plurality of beamlets of a primary electron beam (e.g., plurality of beamlets 214, 216, and 218 of primary electron beam 210 of FIG. 2) to continuously scan an area of a wafer (e.g., wafer 230 of FIG. 2) that includes device structure 440. A controller (e.g., controller 50 of FIG. 1) may include circuitry to adjust the speed of a motorized stage (e.g., motorized wafer stage 280 of FIG. 2) holding the wafer (e.g., wafer 230 of FIG. 2) during inspection so that the time between each beam scan for any given area of the wafer may be adjusted. The circuitry may position the stage at a first position to enable a first beam of the plurality of beams to scan a first surface area of the wafer at a first time to generate a first image associated with the first surface area. The circuitry may continuously move the motorized stage to position the stage at a second position to enable a second beam of the plurality of beams to scan the first surface area at a second time to generate a second image associated with the first surface area. See U.S. Patent Application No. 62/850,461, filed on May 20, 2019, titled System and Method for Scanning a Sample Using Multi-Beam Inspection Apparatus, and the disclosure of which is incorporated herein by reference in its entirety, for more information on continuous scanning using a multi-beam apparatus. It should be noted that the positioning of the stage at a particular position, to enable a beam to scan a particular location on the wafer upon which the beam lands when the stage is at the particular position, may or may not include stopping the stage. For example, in a continuous scan mode, when the stage is positioned so that the particular location on the wafer aligns with a particular beam, the stage may be so positioned only momentarily as the stage continuously moves the wafer.

The circuitry may repeat the aforementioned process for the total number of beams (e.g., 1,000 beamlets) used by the multi-beam electron tool, or for any subset of the beams. For example, a 1000 beamlet system may be comprised of a 10 by 100 array of beams, where all 10 beams in each of the 100 rows are aligned on a row that coincides with the 10 beams. The circuitry may position the stage to scan past 100 locations on the wafer, where each of the 100 locations are scanned by the 10 beams that are in the row that coincides with the location, so that each location is successively scanned by each of the 10 beams in the row that coincides with the location. While a particular location in this example is scanned by beams that are aligned in a row, the beams do not need to be aligned. For example, non-aligned beams can scan a same location, as the beams can be deflected by beam deflectors to cause the non-aligned beams to successively scan a same location on a wafer. In some embodiments, the multi-beam electron beam tool may be configured such that different or overlapping areas of the wafer may be scanned simultaneously. In this example, the first surface area may include device structure 440. The circuitry may construct voltage contrast images of the generated images based on the detection data obtained from the detector. The circuitry may then compare the voltage contrast level of each voltage contrast image of the first surface area to any of the other voltage contrast levels of voltage contrast images and to a voltage contrast level of a reference voltage contrast image to detect differences between the voltage contrast levels (i.e., to detect a defect in the first surface area of the wafer). The aforementioned process may be used on any of a plurality of surface areas on the wafer.

For example, with respect to structure 440, the first beam may generate voltage contrast image 445, the second beam may generate voltage contrast image 446, and a third beam may generate voltage contrast image 447. Advantageously, the multi-beam electron beam tool may generate multiple images of device structure 440 over one or more time sequences and compare those images to each other so that the defect in device structure 440 may be detected. Additionally, the controller includes circuitry to adjust the speed of the motorized stage or the time intervals between the times at which any particular location on a wafer is successively scanned by each of multiple beams. A detector (e.g., detection device 244 of FIG. 2) may be configured to produce detection data based on a detection of a plurality of secondary charged particles (e.g., secondary electron beams 236, 238, and 240 of FIG. 2) associated with the plurality of beamlets of a primary electron beam impacting the first surface area.

Additionally, in some embodiments the circuitry may position the motorized stage of the electron beam tool at a pre-scan position, prior to positioning the stage at the first position, to enable a high-current beam to charge the first surface area at a pre-scan time prior to the first time by supplying electrons to build up the electrical potential on the surface of the wafer. The charging may occur until a device breakdown occurs. After charging the wafer, the electron beam tool may generate images of the first surface area. In some embodiments, the first, second, and additional plurality of beamlets may be low-current beams. In other embodiments, the electron beam tool may use low-energy primary electrons to gradually charge the wafer without inducing a breakdown effect during the charging stage. In other embodiments, the inspection tool may sample and produce voltage contrast images while charging is in progress, so that a transient voltage contrast change can be obtained during charging.

It is appreciated to those skilled in the art that the bright and dark appearances of the images may be changed or reversed depending on the actual processing of the test structures or the electron beam tool settings.

Figure 5:
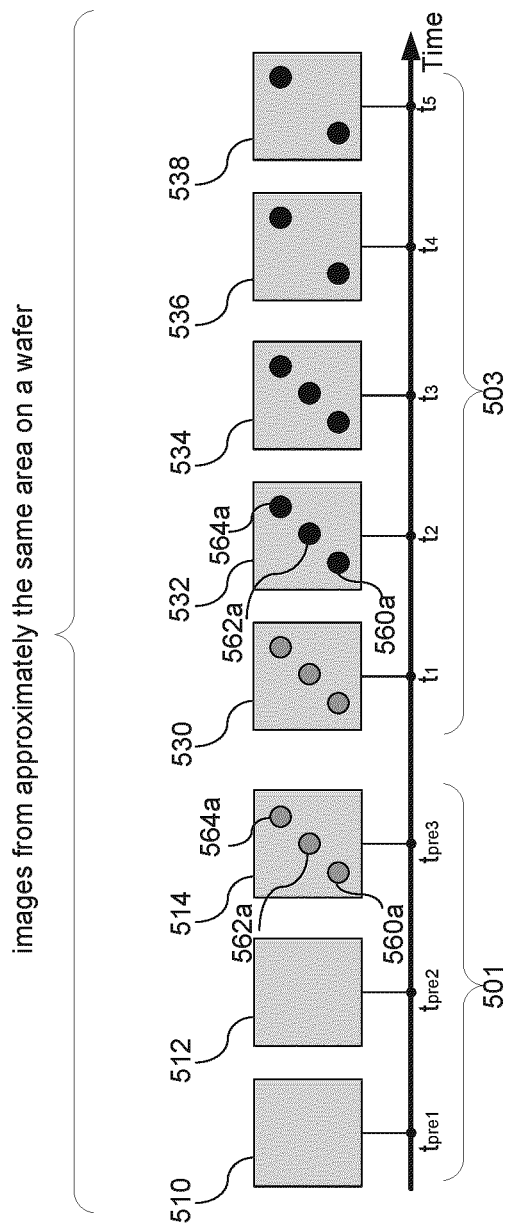
FIG. 5 is an illustration of exemplary voltage contrast images over a time sequence, consistent with embodiments of the present disclosure.

FIG. 5 illustrates exemplary voltage contrast images over a time sequence, consistent with embodiments of the present disclosure. In some embodiments, a wafer inspection process may include a pre-scanning stage 501 and an inspection stage 503. During pre-scanning stage 501, an electron beam tool (e.g., multi-beam electron beam tool 40 of FIG. 2) applies electrons to the surface of a wafer to build up the electrical potential on the surface of the wafer. As explained above, an EBI system (e.g., EBI system 100 of FIG. 1) may use one or more high-current beams to charge a surface area of the wafer and construct voltage contrast images of the surface area during pre-scanning. During inspection stage 503, in some embodiments, the EBI system may construct a plurality of voltage contrast images of the surface area of the wafer using multiple beams over one or more time sequences in a continuous scan mode. As described above, a speed of a motorized stage (e.g., motorized stage 280 of FIG. 2) holding the wafer (e.g., wafer 230 of FIG. 2) may be adjusted throughout the continuous scan such that the length of each time sequence may vary. The EBI system may detect a change in electrical potential on the wafer over time by comparing the plurality of voltage contrast images of the same surface area of the wafer at different times, which may indicate the existence of a device defect.

As shown in FIG. 5, voltage contrast images may be constructed by the EBI system. For example, the motorized stage may position the wafer such that a first beamlet of a primary electron beam (e.g., primary electron beam 210 of FIG. 2) may pre-scan a surface area of the wafer at a time $T_{pre1}$. The motorized stage may continuously move the wafer such that a second beamlet of the primary electron beam may pre-scan the same surface area of the wafer at a time $T_{pre2}$. At $T_{pre1}$ and $T_{pre2}$, the electrical potential of the surface area may not be high enough to show any detectable voltage contrast regions, as shown in voltage contrast images 510 and 512 constructed using the first and second beamlets, respectively. The motorized stage may continuously move through the end of pre-scanning stage 501 to position the wafer such that a third beamlet of the primary electron beam.

In other embodiments, the electron beam tool may skip pre-scanning stage 501 and begin the inspection process with inspection stage 503 to detect wafer defects. In such embodiments, the electron beam tool may begin continuous scanning as soon as the inspection process is initiated. Because no high-current beams are used to charge the surface of the wafer in this embodiment, the scanning during inspection stage 503 may be used to gradually build electrical charges at the surface of the wafer during inspection.

The motorized stage may continuously move such that after pre-scanning stage 501, fourth, fifth, sixth, seventh, eighth, or more beamlets of the primary electron beam may scan the same pre-charged surface area of the wafer at times $t_1$, $t_2$, $t_3$, $t_4$, and $t_5$, respectively. As shown in FIG. 5, the electron beam tool may construct voltage contrast images 530, 532, 534, 536, and 538 using the fourth, fifth, sixth, seventh, and eight beamlets, respectively. While the example illustrates that eight or more beamlets could be used, it is appreciated that less than eight beamlets could be used. For example, it is appreciated that a single beamlet could take multiple images of the surface area.

At time $t_1$, voltage contrast image 530 shows three DVC regions 560a, 562a, and 564a present on the surface area of the wafer. DVC regions 560a, 562a, and 564a may represent the electrical surface potential built-up in a device structure of the pre-scanned surface area. At times $t_2$ and $t_3$, voltage contrast images 532 and 534 show that DVC regions 560a, 562a, and 564a, which may indicate that the built-up positive charges remained in the device structure and unchanged from times $T_{pre3}$ and $t_1$.

At times $t_4$ and $t_5$, voltage contrast images 536 and 538 shows that DVC region 562a disappears while DVC regions 560a and 564a are still present, indicating that the corresponding device structure for DVC region 562a may have lost the built-up positive charges due to leakage current, thereby resulting in a surface potential of DVC region 562a dropping to a non-detectable level (i.e., breakdown effect). For example, the positive charge built-up at the corresponding device structure for DVC region 562a may have neutralized due to device breakdown through a thin device structure defect (see, e.g., insulator structure 470 of FIG. 4).

The electron beam tool may adjust the time intervals (e.g., the time span between $t_1$ and $t_2$) such that beamlets of the primary electron beam may scan a surface area of a wafer more or less frequently. For example, a time interval may be as short as 5 ns such that the signal difference from subtle voltage contrast defects can be obtained, thereby increasing the sensitivity of voltage contrast wafer inspection. Advantageously, the electron beam tool may compare voltage contrast images 510, 512, 514, 530, 532, 534, 536, 538, or more images of the same surface area of the wafer to detect the changes of DVC regions over a time sequence and identify device structure defects.

Although FIG. 5 illustrates three pre-scan voltage contrast images and five inspection voltage contrast images obtained from the electron beam tool, it is appreciated that any number of images may be used to detect device structure defects in a wafer. Furthermore, although the voltage contrast images shown in FIG. 5 illustrate the detection mechanism using dark voltage contrast, it is appreciated that bright voltage contrast may also be used when the electron beam tool operates in the negative mode. For example, in some embodiments, the wafer may have a positive surface potential due to the electron beam tool operating in the positive mode (e.g., $E_1$<Landing Energy<$E_2$). In other embodiments, the wafer may have a negative potential due to the electron beam tool operating in the negative mode (e.g., Landing Energy<$E_1$ or Landing Energy>$E_2$).

Figure 6:
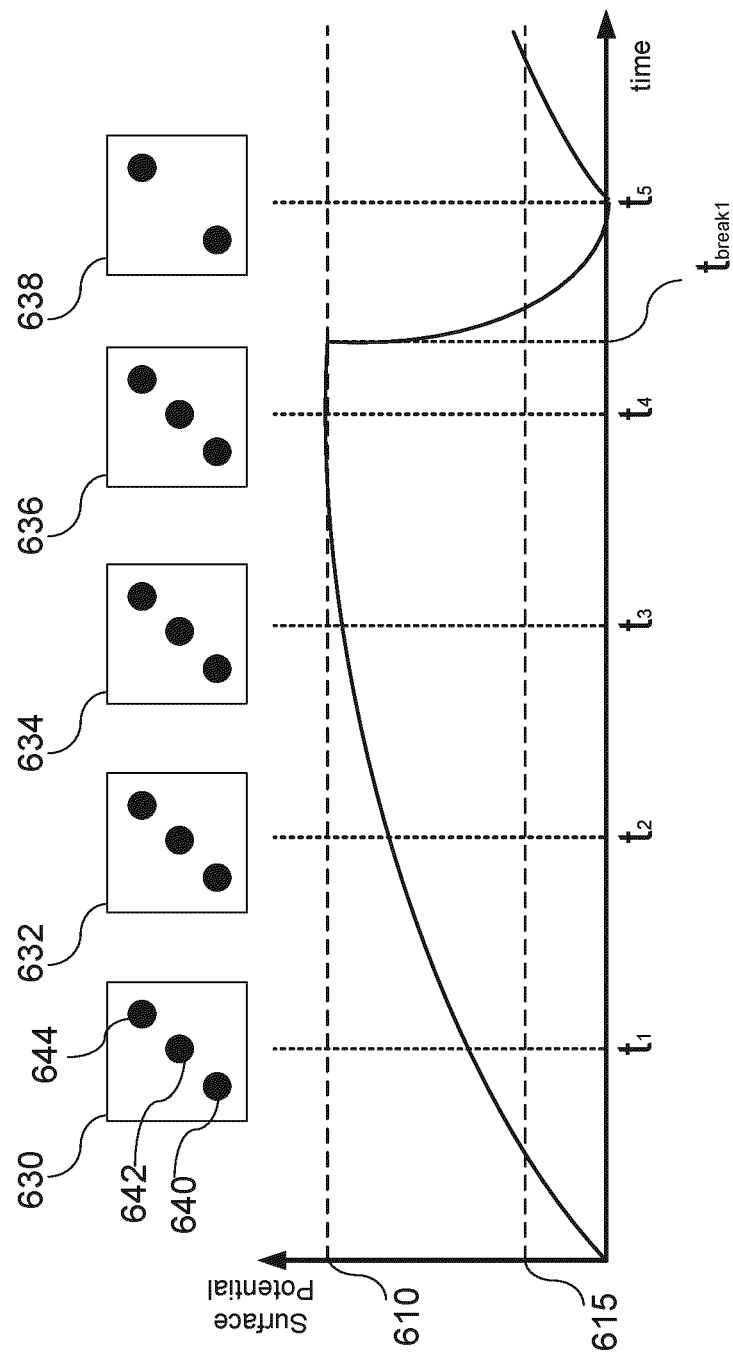
FIG. 6 is an illustration of exemplary voltage contrast images in relation to surface potential change over a time sequence, consistent with embodiments of the present disclosure.

FIG. 6 illustrates exemplary voltage contrast images in relation to surface potential change over a time sequence, consistent with embodiments of the present disclosure. In this embodiment, times $t_1$, $t_2$, $t_3$, $t_4$, and $t_5$ may represent times at which first, second, third, fourth, and fifth beamlets, respectively, of a primary electron beam continuously scan the same surface area of a wafer during inspection. It is appreciated that at any time during the inspection, the beamlets may simultaneously scan different or overlapping areas of the wafer. Positive charges may accumulate on a device structure (e.g., device structure 440 of FIG. 4) of the scanned wafer during inspection. The electrical potential at the surface of the wafer may gradually increase from time zero to an electrical potential 610 until breakdown occurs at $t_{break1}$. Because the electrical potential levels at times $t_1$, $t_2$, $t_3$, and $t_4$ are higher than a threshold voltage 615 of a detector (e.g., detection device 244 of FIG. 2), three DVC regions 640, 642, and 644 may appear in voltage contrast images 630, 632, 634, and 636. When breakdown occurs at time $t_{break1}$, the electrical potential may drop to approximately zero. As a result, the electrical potential is lower than threshold voltage 615 at time $t_5$, thereby causing DVC region 642 to disappear in voltage contrast image 638. Advantageously, the electron beam tool may identify a defect in the wafer by comparing voltage contrast image 638 against voltage contrast images 630, 632, 634, and 636.

Figure 7:
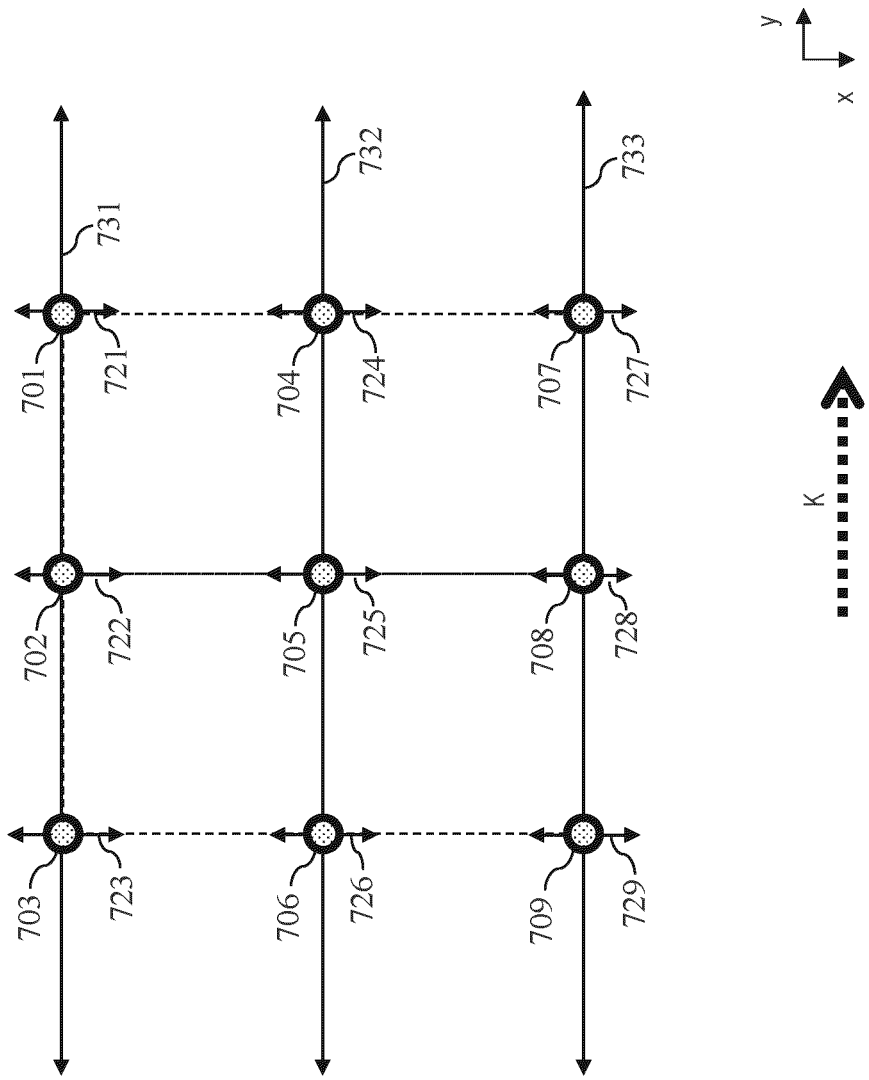
FIG. 7 is an illustration of an exemplary multi-beam configuration of primary beamlets, consistent with embodiments of the present disclosure.

FIG. 7 illustrates an exemplary multi-beam configuration of primary beamlets, consistent with embodiments of the present disclosure. As shown in FIG. 7, a multi-beam 3-by-3 array of primary beamlets creating nine probe spots 701, 702, . . . , 709 may be arranged in a 3×3 matrix configuration. The multi-beam 3-by-3 array may be used in an inspection system (e.g., EBI system 100 of FIG. 1) that may operate in a continuous scan mode. Similar to the earlier embodiments, a controller (e.g., controller 50 of FIG. 1) may include circuitry to adjust the speed of a motorized stage (e.g., motorized wafer stage 280 of FIG. 2) holding a wafer (e.g., wafer 230 of FIG. 2). For example, the wafer may move in the y direction at a speed K while different areas of the wafer are scanned simultaneously by the 3-by-3 array of probe spots 701-709. A speed of the motorized stage may be adjusted throughout the continuous scan such that for any area on the wafer, the time between each beam scan of that area may vary. In some embodiments, the 3-by-3 array of primary beamlets may be rotated by an angle relative to the wafer moving direction, e.g., so that scans by the beams do not overlap any pixel due to the beam scans being offset in the X dimension. In some embodiments, probe spots 701-709 may scan the wafer in a direction perpendicular to the wafer moving direction. For example, probe spots 701-709 may scan in the x direction as illustrated by arrows 721-729, while the wafer moves in y direction. In some embodiments, probe spots 701-709 may scan the wafer in a direction parallel to the wafer moving direction. For example, probe spots 701-709 may move in the y direction as illustrated by arrows 731-733, while the wafer also moves in the y direction. In such embodiments, the scan-width of a primary beamlet may not limited by the configuration of the primary beamlets (e.g., pitches or rotation angles).

In some embodiments, the scanning direction of probe spots 701-709 is parallel to the wafer moving direction. In such embodiments, each probe spot scans a plurality of scan sections positioned along the wafer moving direction. For example, a first row of scan sections (e.g., surface area 810 of FIG. 8; row A of FIG. 9A) may be scanned by the primary beamlets corresponding to probe spots 701, 702, and 703. Similarly, a second row of scan sections (e.g., row B of FIG. 9A) may be scanned by the primary beamlets corresponding to probe spots 704, 705, and 706 and a third row of scan sections (e.g., row C of FIG. 9A) may be scanned by the primary beamlets corresponding to probe spots 707, 708, and 709. It is appreciated that any other scanning method may be used to scan each scan section. For example, in some embodiments, probe spots 701-703 may scan and retrace in opposite directions (e.g., scan from the right to the left and retrace from the left to the right).

Figure 8:
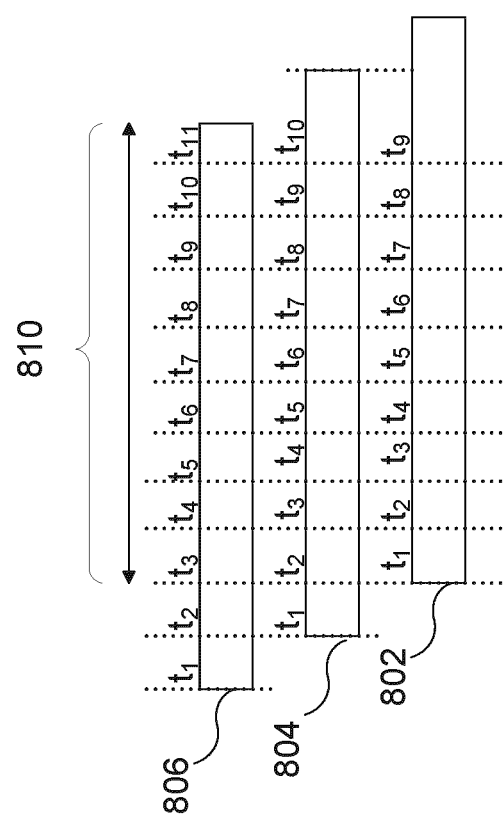
FIG. 8 is an illustration of a multi-beam scanning area on a wafer over a time sequence, consistent with embodiments of the present disclosure.

In some embodiments, some scan sections (e.g., surface area 810 of FIG. 8) may be successively scanned by the same set of beams (e.g., beamlets 802, 804, and 806 of FIG. 8). These regions may be scanned two or more times by one or more beamlets. For example, in a continuous scan mode, a particular location in a region in a first row (wafer region 913 in row A of FIG. 9A) may be successively scanned by probe spots 701, 702, and 703. A controller (e.g., controller 50 of FIG. 1; controller 296 of FIG. 2) may collect scan data, including multiple scan data from each overlap region, and process the scan data to produce a continuous image of the wafer for inspection.

In some embodiments, scanning and repositioning steps may occur while the wafer is continuously moving. In such embodiments, the movement of probe spots may be adjusted to accommodate the continuous movement of the wafer. For example, a scanning route may be extended because the wafer is also moving in the same direction. A retracing route may be shortened because the wafer is moving in the opposite direction relative to the retracing direction (e.g., by the time probe spot 701 is retraced back to the left side, the wafer may have been moved further right).

As described with respect to the earlier embodiments, in some embodiments, the controller may control the movement of primary beamlets and the motorized stage such that the primary beamlets may repeat a pattern of movement. With the controller controlling the speeds of scanning, retracing, repositioning, and motorized stage movement, the probe spots may continuously repeat various movement patterns.

Although FIG. 7 illustrates a configuration of the primary beamlets with nine probe spots 701-709 arranged in a 3×3 matrix, it is appreciated that the principles disclosed herein may be applied to any number and configuration of primary beamlets, such as primary beamlets arranged in a 3×2, 4×4, 5×5, 3×5, 8×5, 20×20, or any size of matrix configuration.

FIG. 8 illustrates a multi-beam scanning area on a wafer over a time sequence, consistent with embodiments of the present disclosure. A multi-beam electron beam tool (e.g., multi-beam electron beam tool 40 of FIG. 2) may inspect a wafer (e.g., wafer 230 of FIG. 2) for defects using a plurality of beamlets of a primary electron beam (e.g., plurality of beamlets 214, 216, and 218 of primary electron beam 210). For example, the plurality of beamlets may comprise a first beamlet 802, a second beamlet 804, and a third beamlet 806. A motorized stage (e.g., motorized stage 280 of FIG. 2) may position the wafer such that beamlets 802, 804, and 806 are aligned in a row. During inspection, a controller (e.g., controller 50 of FIG. 1) may include circuitry to adjust a speed of the motorized stage holding the wafer so that the wafer may continuously move the such that a surface area 810 of the wafer may be scanned one or more times each by beamlet 802 at $t_1$, by beamlet 804 at $t_2$, and by beamlet 806 at $t_3$ and such that times $t_1$, $t_2$, or $t_3$ may be varied. FIG. 8 represents this example as a vertical slice, where the vertical slice starts on the bottom with beamlet 802 scanning a particular location of surface area 810 at $t_1$, beamlet 804 scanning the same particular location at $t_2$, and beamlet 806 scanning the same particular location at $t_3$. As explained above, the electron beam tool may construct voltage contrast images of surface area 810 corresponding to each of beamlets 802, 804, and 806. Advantageously, the electron beam tool may identify a defect in surface area 810 by comparing voltage contrast images corresponding to each of beamlets 802, 804, and 806. While the example illustrates that at least one of beamlets 802, 804, and 806 scan the wafer from time $t_1$ to time $t_{11}$ at the depicted intervals, it is appreciated that the time intervals may be adjusted by adjusting the speed of the motorized stage throughout a continuous scan so that beamlets scan the wafer more or less frequently than depicted in FIG. 8. For example, it is appreciated that a single beamlet could take multiple images of the surface area.

Figure 9A:
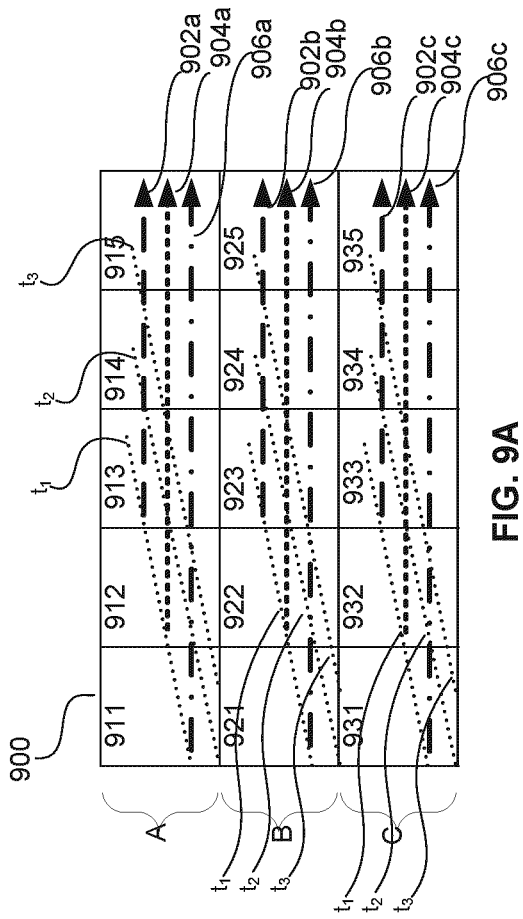
FIG. 9A is an illustration of a multi-beam scanning area on a wafer over a time sequence, consistent with embodiments of the present disclosure.

FIG. 9A illustrates a multi-beam scanning area on a wafer 900 over a time sequence, consistent with embodiments of the present disclosure. Similar to FIG. 8, a multi-beam electron beam tool (e.g., multi-beam electron beam tool 40 of FIG. 2) may inspect a wafer (e.g., wafer 230 of FIG. 2) for defects in continuous scan mode using a plurality of beamlets of a primary electron beam (e.g., plurality of beamlets 214, 216, and 218 of primary electron beam 210). For example, the plurality of beamlets may comprise a 3×3 beam configuration where a first row A comprises beamlets 902a, 904a, and 906a, a second row B comprises beamlets 902b, 904b, and 906b, and a third row C comprises beamlets 902c, 904c, and 906c. Row A may comprise wafer regions 911-915, row B may comprise wafer regions 921-925, and row C may comprise wafer regions 931-935.

In some embodiments, the multi-beam electron beam tool may construct one or more voltage contrast images for each of wafer regions 911-915, 921-925, and 931-935. For example, in a continuous scan mode, wafer region 913 may be scanned by beamlet 902a at a time $t_1$, scanned by beamlet 904a at a time $t_2$, and scanned by beamlet 906a at a time $t_3$. Similarly, wafer region 923 may be scanned by beamlet 902b at a time $t_1$, scanned by beamlet 904b at a time $t_2$, and scanned by beamlet 906b at a time $t_3$. Again similarly, wafer region 933 may be scanned by beamlet 902c at a time $t_1$, scanned by beamlet 904c at a time $t_2$, and scanned by beamlet 906c at a time $t_3$. As explained above, the electron beam tool may construct voltage contrast images of each wafer region corresponding to each of beamlets 902a-902c, 904a-904c, and 906a-906c. Advantageously, the electron beam tool may identify defects in one or more of wafer regions 911-915, 921-925, and 931-935 by comparing voltage contrast images corresponding to each of the beamlets. A controller (e.g., controller 50 of FIG. 1) may include circuitry to adjust the speed of a motorized stage (e.g., motorized wafer stage 280 of FIG. 2) holding the wafer during inspection so that times $t_1$, $t_2$, or $t_3$ may be varied. While FIG. 9A has lines representing beam scans (e.g., beamlets 902a, 904a, 906a) which are offset in the vertical dimension, this is for illustration purposes only, and the beams may not be offset in the vertical dimension and may successively scan a same location on a wafer.

As explained above, images may be generated more frequently if the electron beam tool may continuously scan each row multiple times using multiple beams. After continuously scanning all the regions multiple times using multiple beams, an image processing system (e.g., image processing system 290 of FIG. 2) may reconstruct images by reassembling scan data produced during each scan. As a result, an electron beam tool using such embodiments may be able to better detect a time-dependent defect in a fast-charging or discharging device structure.

Although FIG. 9A illustrates a 3×3 beam configuration, it is appreciated that other beam configurations may be used during inspection.

Figure 9B:
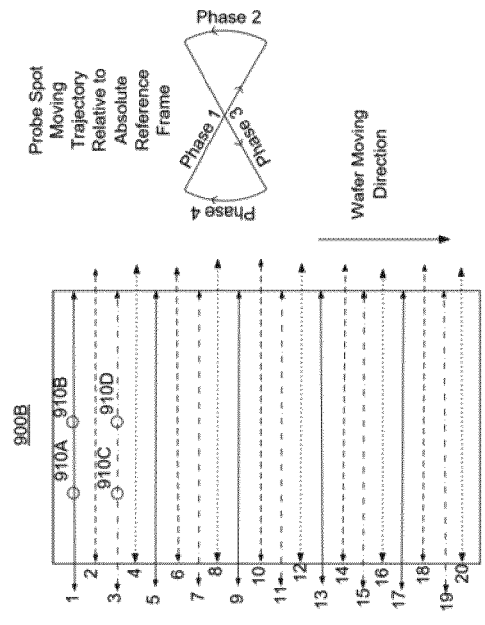
FIG. 9B is an illustration of a multi-beam interlaced scanning pattern, consistent with embodiments of the present disclosure.

FIG. 9B illustrates a multi-beam interlaced scanning pattern 900B, consistent with embodiments of the present disclosure. The primary beamlets (e.g., beamlets 214, 216, and 218 of FIG. 2) may be configured to scan a wafer (e.g., wafer 230 of FIG. 2) using an interlaced scanning pattern in a continuous scan mode. As shown in FIG. 9B, the e-beam tool may control the primary beamlets such that probe spots 910A, 910B, 910C, and 910D move along scan lines 1-20. For example, probe spots 910A and 910B may move along scan lines 1-18 and probe spots 910C and 910D may move along scan lines 3-20. These scan lines are substantially parallel to each other. In this configuration, probe spots 910A-910D may continuously and simultaneously move among different scan lines according to a speed of a motorized stage (e.g., motorized stage 280 of FIG. 2) holding the wafer. It is appreciated that the speed of the motorized stage may be adjusted so that the time between each beam scan for any given area of the wafer may be adjusted.

The right side of FIG. 9B shows an exemplary moving trajectory of a probe spot relative to the absolute reference frame. The trajectory may be divided into four phases. In phase 1, the probe spot follows the movement of the wafer and scans along a first direction. In phase 2, the probe spot moves against the moving direction of the wafer, so as to arrive at the starting point of a second scan line. In phase 3, the probe spot follows the movement of the wafer and scans along a second direction. In phase 4, the probe spot moves against the moving direction of the wafer, so as to arrive at the starting point of a third scan line. The four phases are repeated during the interlaced scanning. As explained above, any area of the wafer may be scanned multiple times by any one of probe spots 910A, 910B, 910C, or 910D. See FIG. 11 of U.S. Patent Application No. 62/850,461 for more information on continuous scanning using a multi-beam apparatus.

Although FIG. 9B illustrates a configuration of the primary beamlets with four probe spots 910A-910D arranged in a 2×2 matrix, it is appreciated that the principles disclosed herein may be applied to any number and configuration of primary beamlets, such as primary beamlets arranged in a 3×2, 4×4, 5×5, 3×5, 8×5, 20×20, or any size of matrix configuration.

Figure 10:
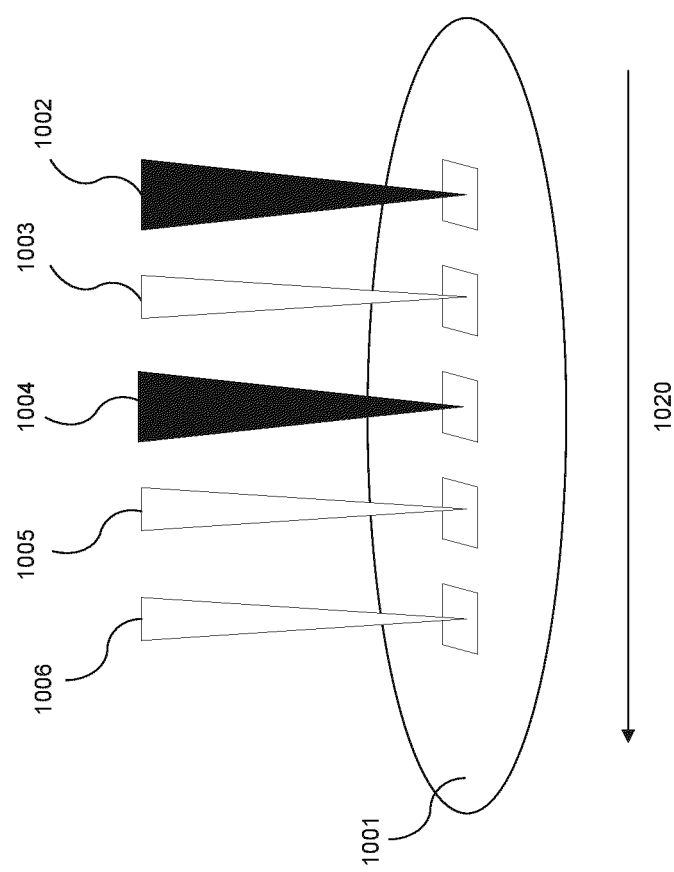
FIG. 10 is an illustration of beam currents on a wafer, consistent with embodiments of the present disclosure.

FIG. 10 illustrates beam currents on a wafer 1001, consistent with embodiments of the present disclosure. Some materials on the wafer 1001 may require a multi-beam electron beam tool (e.g., multi-beam electron beam tool 40 of FIG. 2) to pre-scan at least one area of wafer 1001 in order to detect defects in the areas. Depending on the materials on wafer 1001, the electron beam tool may adjust the current of each beamlet of a primary electron beam (e.g., primary electron beam 210). Each beam current may be adjusted directly or indirectly by, for example, adjusting a depth of focus of the beam, among others. For example, beamlets 1002 and 1004 may be configured to be high-current beams for pre-scanning at least one area of wafer 1001 while beamlets 1003, 1005, and 1006 may be configured to be low-current beams for inspecting the same areas of wafer 1001. A motorized stage (e.g., motorized wafer stage 280 of FIG. 2) holding wafer 1001 may continuously move in a direction 1020 during inspection such that each of beamlets 1002-1006 may continuously scan one or more common areas of wafer 1001. The controller may include circuitry to adjust the speed of the motorized stage holding the wafer during inspection so that the time for each beam scan of any given area of the wafer may be adjusted.

Advantageously, the electron beam tool may identify defects in one or more areas of wafer 1001 by comparing voltage contrast images corresponding to each of the beamlets. While the example illustrates that five beamlets could be used, it is appreciated that more or less than five beamlets could be used. For example, it is appreciated that a single beamlet could take multiple images of the surface area.

Figure 11:
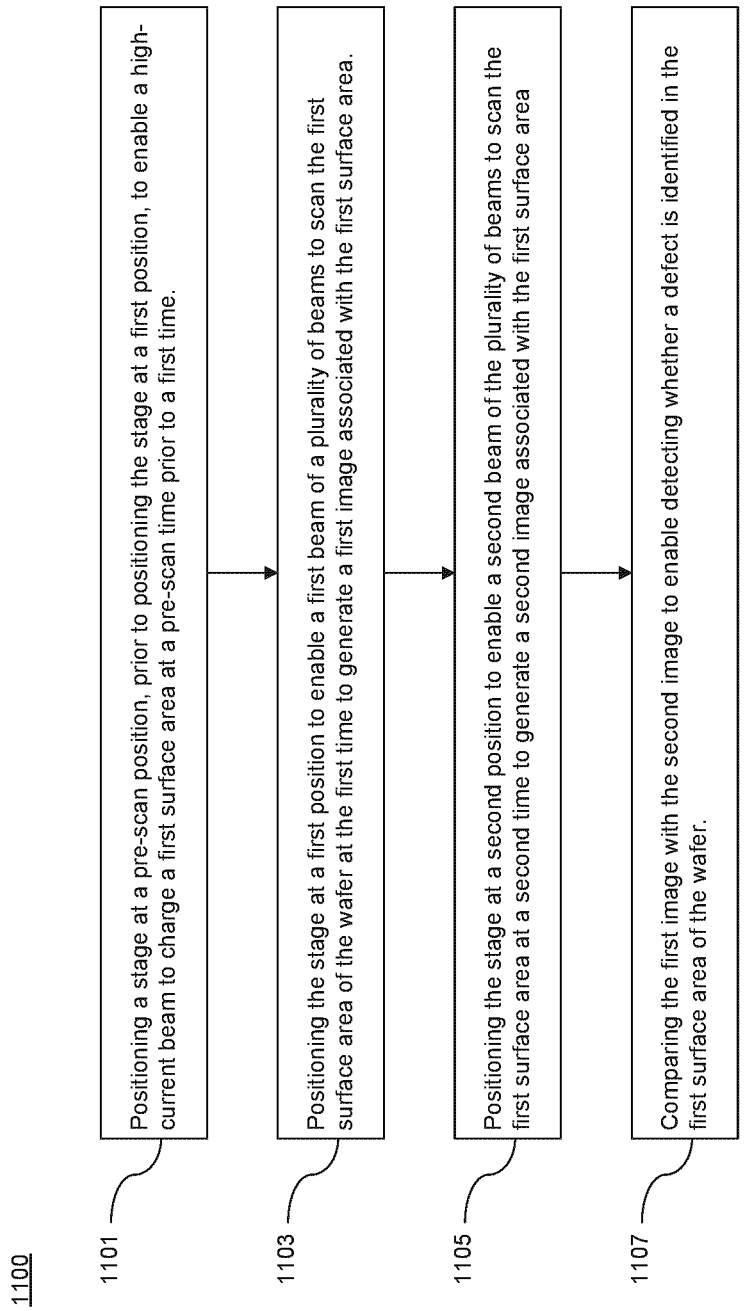
FIG. 11 is a flowchart representing an exemplary method of wafer inspection, consistent with embodiments of the present disclosure.

FIG. 11 illustrates a flowchart representing an exemplary method 1100 of wafer inspection, consistent with embodiments of the present disclosure. Method 1100 may be performed by an EBI system (e.g., EBI system 100 of FIG. 1). The EBI system may include an electron beam tool (e.g., multi-beam electron beam tool 40 of FIG. 2) that performs one or more steps of method 1500.

In step 1101, an EBI system comprising a controller (e.g., controller 50 of FIG. 1) may include circuitry to adjust the speed of a motorized stage (e.g., motorized stage 280 of FIG. 2) holding a wafer (e.g., wafer 230 of FIG. 2) to position a wafer by continuously moving the wafer to a pre-scan position, prior to positioning the motorized stage at a first position, to enable a high-current beam (e.g., high-current beamlet 1002 of FIG. 10) to charge a first surface area of the wafer at a pre-scan time (e.g., pre-scan stage 501 of FIG. 5) prior to a first time. The charging may occur until a device breakdown occurs. After charging the wafer, the EBI system may generate images of the first surface area. In some embodiments, the EBI system may sample and produce voltage contrast images while charging is in progress, so that a transient voltage contrast change can be obtained during charging. It should be noted that the positioning of the wafer at the pre-scan position, to enable a beam to charge the first surface area of the wafer upon which the beam lands when the stage is at the pre-scan position, may or may not include stopping the stage. For example, in a continuous scan mode, when the stage is positioned so that the beam aligns with the first surface area, the stage may be so positioned only momentarily as the stage continuously moves the wafer.

In step 1103, the EBI system may adjust the speed of the motorized stage holding the wafer to continuously move the wafer to the first position, or may position the motorized stage at the first position during a mode other than continuous scan to enable a first beam (e.g., beamlet 902a of FIG. 9A; low-current beamlet 1005 of FIG. 10) of a plurality of beams to scan the first surface area of the wafer (e.g., region 913 of FIG. 9A) at the first time to generate a first image associated with the first surface area (e.g., image 530 of FIG. 5). The EBI system may construct a voltage contrast image of the generated image based on detection data obtained from a detector (e.g., detection device 244 of FIG. 2). An example of a mode other than continuous scan is a step and scan mode, where the motorized stage positions the wafer at a first location, then that field of view is scanned while the wafer remains at the first position, and then the motorized stage positions the wafer at a second location, then that new field of view is scanned while the wafer remains at the second position.

In step 1105, the EBI system may adjust the speed of the motorized stage holding the wafer to continuously move the wafer to a second position, or may position the motorized stage at the second position during a mode other than continuous scan, to enable a second beam (e.g., beamlet 904a of FIG. 9A; low-current beamlet 1006 of FIG. 10) of a plurality of beams to scan the first surface area of the wafer (e.g., region 913 of FIG. 9A) at a second time to generate a second image associated with the first surface area (e.g., image 536 of FIG. 5). The EBI system may construct a voltage contrast image of the generated image based on detection data obtained from the detector.

In step 1107, the EBI system may compare the voltage contrast level of each voltage contrast image of the first surface area to any of the other voltage contrast levels of voltage contrast images to detect differences between the voltage contrast levels for identifying any defects in the first surface area of the wafer). Method 1100 may be used on any of a plurality of surface areas on the wafer. Advantageously, the EBI system may identify defects in one or more surface areas of the wafer by comparing voltage contrast images corresponding to each of the beamlets.

In any of the aforementioned steps, the controller may adjust the speed of the motorized stage holding the wafer so that the time for each scan for any given area of the wafer may be adjusted.

The embodiments may further be described using the following clauses:

1. A charged particle multi-beam system for generating a plurality of beams for inspecting a wafer positioned on a stage, the system comprising:
a controller including circuitry configured to:
position the stage at a first position to enable a first beam of the plurality of beams to scan a first surface area of the wafer at a first time to generate a first image associated with the first surface area;
position the stage at a second position to enable a second beam of the plurality of beams to scan the first surface area at a second time to generate a second image associated with the first surface area; and
compare the first image with the second image to enable detecting whether a defect is identified in the first surface area of the wafer.

2. The system of clause 1, wherein the wafer comprises a plurality of surface areas.

3. The system of any one of clauses 1-2, wherein the first and second images indicate voltage contrast levels.

4. The system of clause 3, wherein the controller includes circuitry to detect differences between the voltage contrast levels of the first and second images.

5. The system of any one of clauses 1-4, wherein the controller includes circuitry to adjust a time interval between the first and second times.

6. The system of clause 5, wherein adjusting the time interval between the first and second times comprises adjusting a speed of the stage.

7. The system of any one of clauses 1-6, further comprising:
a detector, communicatively coupled to the controller, configured to produce detection data based on a detection of a plurality of secondary charged particles associated with the first and second beams impacting the first surface area.

8. The system of any one of clauses 1-7, wherein:
the controller includes circuitry configured to:
position the stage at a third position to enable a third beam of the plurality of beams to scan the first surface area at a third time to generate a third image associated with the first surface area; and
compare the third image to the first image or the second image to enable detecting whether a defect is identified in the first surface area of the wafer.

9. The system of clause 8, wherein the controller includes circuitry to adjust a time interval between each of the first, second, and third times.

10. The system of clause 9, wherein adjusting the time interval between each of the first, second, and third times comprises adjusting a speed of the stage.

11. The system of any one of clauses 8-10, wherein the third image indicates voltage contrast levels.

12. The system of clause 11, wherein the controller includes circuitry configured to detect differences between the voltage contrast levels of the first, second, and third images.

13. The system of any one of clauses 7-12, wherein:
the detector is configured to produce detection data based on a detection of a plurality of secondary charged particles associated with the first, second, and third beams impacting the first surface area.

14. The system of any one of clauses 8-13, wherein the first, second, and third beams are low-current beams.

15. The system of any one of clauses 8-14, wherein the first beam has a first current and the second and third beams have a second current different from the first current.

16. The system of any one of clauses 8-14, wherein the first and second beams have a first current and the third beam has a second current different from the first current.

17. The system of any one of clauses 1-16, wherein the controller includes circuitry configured to:
position the stage at a pre-scan position, prior to positioning the stage at the first position, to enable a high-current beam to charge the first surface area at a pre-scan time prior to the first time.

18. The system of clause 17, wherein a device breakdown occurs during the charging.

19. The system of any one of clauses 1-18, wherein the defect comprises an electrical defect associated with an electrical leakage.

20. The system of any one of clauses 11 and 12, wherein the controller includes circuitry configured to construct first, second, and third voltage contrast images corresponding to the first, second, and third images based on the detection data produced by the detector.

21. The system of any one of clauses 1-7, wherein:
the controller includes circuitry configured to:
position the stage at the first position to enable a third beam of the plurality of beams to scan a second surface area of the wafer at the first time to generate a third image associated with the second surface area;
position the stage at the second position to enable a fourth beam of the plurality of beams to scan the second surface area of the wafer at the second time to generate a fourth image associated with the second surface area; and
compare the third image to the fourth image to enable detecting whether a defect is identified in the second surface area of the wafer.

22. The system of clause 21, wherein the third and fourth images indicate voltage contrast levels.

23. The system of clause 22 wherein the controller includes circuitry configured to detect differences between the voltage contrast levels of the third and fourth images.

24. The system of any one of clauses 21-23, wherein:
the detector is configured to produce detection data based on a detection of a plurality of secondary charged particles associated with the third and fourth beams impacting the second surface area.

25. The system of clause 24, wherein the controller includes circuitry configured to construct third and fourth voltage contrast images corresponding to the third and fourth images based on the detection data produced by the detector.

26. The system of any one of clauses 1-25, wherein positioning of the stage at the first and second positions involve a continuous movement of the stage.

27. The system of any one of clauses 1-26, wherein the beam current of each of the plurality of beams is constant during inspection.

28. A method for generating a plurality of beams for inspecting a wafer positioned on a stage, the method comprising:
positioning the stage at a first position to enable a first beam of the plurality of beams to scan a first surface area of the wafer at a first time to generate a first image associated with the first surface area;

positioning the stage at a second position to enable a second beam of the plurality of beams to scan the first surface area at a second time to generate a second image associated with the first surface area; and comparing the first image with the second image to enable detecting whether a defect is identified in the first surface area of the wafer.

29. The method of clause 28, wherein the wafer comprises a plurality of surface areas.

30. The method of any one of clauses 28-29, wherein the first and second images indicate voltage contrast levels.

31. The method of clause 30, comprising detecting differences between the voltage contrast levels of the first and second images.

32. The method of any one of clauses 28-31, comprising adjusting a time interval between the first and second times.

33. The method of clause 32, wherein adjusting the time interval between the first and second times comprises adjusting a speed of the stage.

34. The method of any one of clauses 28-33, comprising:
a detector, communicatively coupled to the controller, configured to produce detection data based on a detection of a plurality of secondary charged particles associated with the first and second, beams impacting the first surface area.

35. The method of any one of clauses 28-34, comprising:
positioning the stage at a third position to enable a third beam of the plurality of beams to scan the first surface area at a third time to generate a third image associated with the first surface area; and
comparing the third image to the first image or the second image to enable detecting whether a defect is identified in the first surface area of the wafer.

36. The method of clause 35, comprising adjusting a time interval between each of the first, second, and third times.

37. The method of clause 36, wherein adjusting the time interval between each of the first, second, and third times comprises adjusting a speed of the stage.

38. The method any one of clauses 35-37, wherein the third image indicates voltage contrast levels.

39. The method of clause 38, comprising detecting differences between the voltage contrast levels of the first, second, and third images.

40. The method of any one of clauses 35-39, wherein:
the detector is configured to produce detection data based on a detection of a plurality of secondary charged particles associated with the first, second, and third beams impacting the first surface area.

41. The method of any one of clauses 35-40, wherein the first, second, and third beams are low-current beams.

42. The method of any one of clauses 35-41, wherein the first beam has a first current and the second and third beams have a second current different from the first current.

43. The method of any one of clauses 35-41, wherein the first and second beams have a first current and the third beam has a second current different from the first current.

44. The method of any one of clauses 28-43, comprising:
positioning the stage at a pre-scan position, prior to positioning the stage at the first position, to enable a high-current beam to charge the first surface area at a pre-scan time prior to the first time.

45. The method of clause 44, wherein a device breakdown occurs during the charging.

46. The method of any one of clauses 28-45, wherein the defect comprises an electrical defect associated with an electrical leakage.

47. The method of any one of clauses 40-43, comprising constructing first, second, and third voltage contrast images corresponding to the first, second, and third images based on the detection data produced by the detector.

48. The method of any one of clauses 28-34, comprising:
positioning the stage at the first position to enable a third beam of the plurality of beams to scan a second surface area of the wafer at the first time to generate a third image associated with the second surface area;
positioning the stage at the second position to enable a fourth beam of the plurality of beams to scan the second surface area of the wafer at the second time to generate a fourth image associated with the second surface area; and
comparing the third image to the fourth image to enable detecting whether a defect is identified in the second surface area of the wafer.

49. The method of clause 48, wherein the third and fourth images indicate voltage contrast levels.

50. The method of clause 49, comprising detecting differences between the voltage contrast levels of the third and fourth images.

51. The method of any one of clauses 48-50, wherein:
the detector is configured to produce detection data based on a detection of a plurality of secondary charged particles associated with the third and fourth beams impacting the second surface area.

52. The method of clause 51, comprising constructing third and fourth voltage contrast images corresponding to the third and fourth images based on the detection data produced by the detector.

53. The method of any one of clauses 28-52, wherein positioning of the stage at the first and second positions involve a continuous movement of the stage.

54. The method of any one of clauses 28-53, wherein the beam current of each of the plurality of beams is constant during inspection.

55. A non-transitory computer readable medium that stores a set of instructions that is executable by at least one processor of a computing device to cause the computing device to perform a method for generating a plurality of beams for inspecting a wafer positioned on a stage, the method comprising:
positioning the stage at a first position to enable a first beam of the plurality of beams to scan a first surface area of the wafer at a first time to generate a first image associated with the first surface area;
positioning the stage at a second position to enable a second beam of the plurality of beams to scan the first surface area at a second time to generate a second image associated with the first surface area; and
comparing the first image with the second image to enable detecting whether a defect is identified in the first surface area of the wafer.

56. The non-transitory computer readable medium of clause 55, wherein the first and second images indicate voltage contrast levels.

57. The non-transitory computer readable medium of clause 56, wherein the set of instructions that is executable by the at least one processor of the computing device to cause the computing device to further perform:
detecting differences between the voltage contrast levels of the first and second images.

58. The non-transitory computer readable medium of any one of clauses 55-57, wherein the set of instructions that is executable by the at least one processor of the computing device to cause the computing device to further perform:
adjusting a time interval between the first and second times.

59. The non-transitory computer readable medium of clause 58, wherein adjusting the time interval between the first and second times comprises adjusting a speed of the stage.

60. The non-transitory computer readable medium of any one of clauses 55-59, comprising:
a detector, communicatively coupled to the controller, configured to produce detection data based on a detection of a plurality of secondary charged particles associated with the first and second, beams impacting the first surface area.

61. The non-transitory computer readable medium of any one of clauses 55-60, wherein the set of instructions that is executable by the at least one processor of the computing device to cause the computing device to further perform:
positioning the stage at a third position to enable a third beam of the plurality of beams to scan the first surface area at a third time to generate a third image associated with the first surface area; and
comparing the third image to the first image or the second image to enable detecting whether a defect is identified in the first surface area of the wafer.

62. The non-transitory computer readable medium of clause 61, wherein the set of instructions that is executable by the at least one processor of the computing device to cause the computing device to further perform:
adjusting a time interval between each of the first, second, and third times.

63. The non-transitory computer readable medium of clause 62, wherein adjusting the time interval between each of the first, second, and third times comprises adjusting a speed of the stage.

64. The non-transitory computer readable medium of any one of clauses 61-63, wherein the third image indicates voltage contrast levels.

65. The non-transitory computer readable medium of any one of clauses 61-64, wherein the set of instructions that is executable by the at least one processor of the computing device to cause the computing device to further perform:
detecting differences between the voltage contrast levels of the first, second, and third images.

66. The non-transitory computer readable medium of any one of clauses 61-65 wherein:
the detector is configured to produce detection data based on a detection of a plurality of secondary charged particles associated with the first, second, and third beams impacting the first surface area.

67. The non-transitory computer readable medium of any one of clauses 61-66, wherein the first, second, and third beams are low-current beams.

68. The non-transitory computer readable medium of any one of clauses 61-67, wherein the first beam has a first current and the second and third beams have a second current different from the first current.

69. The non-transitory computer readable medium of any one of clauses 61-67, wherein the first and second beams have a first current and the third beam has a second current different from the first current.

70. The non-transitory computer readable medium of any one of clauses 55-69, wherein the set of instructions that is executable by the at least one processor of the computing device to cause the computing device to further perform:
positioning the stage at a pre-scan position, prior to positioning the stage at the first position, to enable a high-current beam to charge the first surface area at a pre-scan time prior to the first time.

71. The non-transitory computer readable medium of clause 70, wherein a device breakdown occurs during the charging.

72. The non-transitory computer readable medium of any one of clauses 55-71, wherein the defect comprises an electrical defect associated with an electrical leakage.

73. The non-transitory computer readable medium of clause 66, wherein the set of instructions that is executable by the at least one processor of the computing device to cause the computing device to further perform:
constructing first, second, and third voltage contrast images corresponding to the first, second, and third images based on the detection data produced by the detector.

74. The non-transitory computer readable medium of any one of clauses 55-60, wherein the set of instructions that is executable by the at least one processor of the computing device to cause the computing device to further perform:
positioning the stage at the first position to enable a third beam of the plurality of beams to scan a second surface area of the wafer at the first time to generate a third image associated with the second surface area;
positioning the stage at the second position to enable a fourth beam of the plurality of beams to scan the second surface area of the wafer at the second time to generate a fourth image associated with the second surface area; and
comparing the third image to the fourth image to enable detecting whether a defect is identified in the second surface area of the wafer.

75. The non-transitory computer readable medium of clause 74, wherein the third and fourth images indicate voltage contrast levels.

76. The non-transitory computer readable medium of clause 75, wherein the set of instructions that is executable by the at least one processor of the computing device to cause the computing device to further perform:
detecting differences between the voltage contrast levels of the third and fourth images.

77. The non-transitory computer readable medium of any one of clauses 74-76, wherein:
the detector is configured to produce detection data based on a detection of a plurality of secondary charged particles associated with the third and fourth beams impacting the second surface area.

78. The non-transitory computer readable medium of clause 77, wherein the set of instructions that is executable by the at least one processor of the computing device to cause the computing device to further perform:
constructing third and fourth voltage contrast images corresponding to the third and fourth images based on the detection data produced by the detector.

79. The non-transitory computer readable medium of any one of clauses 55-78, wherein positioning of the stage at the first and second positions involve a continuous movement of the stage.

80. The non-transitory computer readable medium of any one of clauses 55 79, wherein beam current of each of the plurality of beams is constant during inspection.

81. A method of inspecting a wafer, the method comprising:

adjusting a time between each scan of a pixel on the wafer by adjusting a speed of a stage holding the wafer; and
scanning the pixel using a plurality of beams, wherein each scan occurs at a different time by a different beam of the plurality of beams scanning the pixel.

82. The method of clause 81, further comprising:
adjusting a beam current of a beam of the plurality of beams, wherein the scanning of the pixel comprises scanning the pixel at multiple beam currents.

83. The method of clause 82, wherein a beam current of each of the plurality of beams remains constant during the scan.

A non-transitory computer readable medium may be provided that stores instructions for a processor of a controller (e.g., controller 50 of FIG. 1) for controlling wafer inspection described above such as positioning the stage with respect to the multiple beams, timing the positionings, imaging the areas of the wafer, and determining the differences between voltage contrast images, consistent with embodiments in the present disclosure. For example, based on the material on the wafer to be inspected, the controller may use circuitry to adjust the currents of the beamlets or the speed of the motorized stage. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A charged particle multi-beam system for generating a plurality of beams for inspecting a wafer positioned on a stage, the system comprising:
a controller including circuitry configured to:
position the stage at a first position to enable a first beam of the plurality of beams to scan a first surface area of the wafer at a first time to generate a first image associated with the first surface area;
position the stage at a second position to enable a second beam of the plurality of beams to scan the first surface area at a second time to generate a second image associated with the first surface area; and
compare the first image with the second image to enable detecting whether a defect is identified in the first surface area of the wafer.

2. The system of claim 1, wherein the wafer comprises a plurality of surface areas.

3. The system of claim 1, wherein the first and second images indicate voltage contrast levels.

4. The system of claim 3, wherein the controller includes circuitry to detect differences between the voltage contrast levels of the first and second images.

5. The system of claim 1, wherein the controller includes circuitry to adjust a time interval between the first and second times.

6. The system of claim 5, wherein adjusting the time interval between the first and second times comprises adjusting a speed of the stage.

7. The system of claim 1, further comprising:
a detector, communicatively coupled to the controller, configured to produce detection data based on a detection of a plurality of secondary charged particles associated with the first and second beams impacting the first surface area.

8. The system of claim 1, wherein:
the controller includes circuitry configured to:
position the stage at a third position to enable a third beam of the plurality of beams to scan the first surface area at a third time to generate a third image associated with the first surface area; and
compare the third image to the first image or the second image to enable detecting whether a defect is identified in the first surface area of the wafer.

9. The system of claim 8, wherein the controller includes circuitry to adjust a time interval between each of the first, second, and third times.

10. The system of claim 9, wherein adjusting the time interval between each of the first, second, and third times comprises adjusting a speed of the stage.

11. The system of claim 8, wherein the third image indicates voltage contrast levels.

12. The system of claim 11, wherein the controller includes circuitry configured to detect differences between the voltage contrast levels of the first, second, and third images.

13. The system of claim 7, wherein:
the detector is configured to produce detection data based on a detection of a plurality of secondary charged particles associated with the first, second, and third beams impacting the first surface area.

14. The system of claim 8, wherein the first, second, and third beams are low-current beams.

15. A non-transitory computer readable medium that stores a set of instructions that is executable by at least one processor of a computing device to cause the computing device to perform a method for generating a plurality of beams for inspecting a wafer positioned on a stage, the method comprising:
positioning the stage at a first position to enable a first beam of the plurality of beams to scan a first surface area of the wafer at a first time to generate a first image associated with the first surface area;
positioning the stage at a second position to enable a second beam of the plurality of beams to scan the first surface area at a second time to generate a second image associated with the first surface area; and comparing the first image with the second image to enable detecting whether a defect is identified in the first surface area of the wafer.

* * * * *